(12) United States Patent
Yoshinaka et al.

(10) Patent No.: US 7,819,965 B2
(45) Date of Patent: Oct. 26, 2010

(54) COATING FORMULATION AND PROCESS FOR THE PRODUCTION OF TITANATE-BASED CERAMIC FILM WITH THE COATING FORMULATION

(75) Inventors: Atsuya Yoshinaka, Arakawa-ku (JP); Daisuke Takagi, Arakawa-ku (JP)

(73) Assignee: Adeka Corporation, Tokyo (JP)

( * ) Notice: Subject to any disclaimer, the term of this patent is extended or adjusted under 35 U.S.C. 154(b) by 390 days.

(21) Appl. No.: 11/866,107

(22) Filed: Oct. 2, 2007

(65) Prior Publication Data

US 2008/0090006 A1 Apr. 17, 2008

(30) Foreign Application Priority Data

Oct. 12, 2006 (JP) .............................. 2006-278837

(51) Int. Cl.
*C09D 5/25* (2006.01)
(52) U.S. Cl. ............................................... 106/287.19
(58) Field of Classification Search ............. 106/287.19
See application file for complete search history.

(56) References Cited

U.S. PATENT DOCUMENTS 5,690,727 A * 11/1997 Azuma et al. .......... 106/287.18
6,143,063 A * 11/2000 Hayashi et al. ........ 106/287.18
2006/0124890 A1* 6/2006 Sunahara et al. ........ 252/62.9 R

FOREIGN PATENT DOCUMENTS

| JP | 5-58636 | 3/1993 |
| JP | 5-230079 | 9/1993 |
| JP | 11-502262 | 2/1999 |
| JP | 2005-213105 | 8/2005 |
| JP | 2005-247632 | 9/2005 |
| WO | WO 96/29447 | 9/1996 |
| WO | WO9629447 * | 9/1996 |
| WO | WO 2004/097854 A1 | 11/2004 |

\* cited by examiner

*Primary Examiner*—David M Brunsman
(74) *Attorney, Agent, or Firm*—Oblon, Spivak, McClelland, Maier & Neustadt, L.L.P.

(57) ABSTRACT

A coating formulation contains the following components (A), (B) and (C): (A) an organic acid-titanium compound having at least one titanium atom and at least one $C_{2-12}$ aliphatic organic acid residual group as essential constituents and having no constituent other than the essential constituents, (B) fine particles of a titanate-based compound, said fine particles having an average particle size of from 10 to 100 nm, and (C) an organic solvent. A content of the components (A) is from 0.1 to 1.5 mol/kg in terms of titanium atoms, and a content of the component (B) is from 0.1 to 1.5 mol/kg in terms of titanium atoms. A production process for a titanate-based ceramic film, which makes use of the coating formulation, is also disclosed.

20 Claims, No Drawings

COATING FORMULATION AND PROCESS FOR THE PRODUCTION OF TITANATE-BASED CERAMIC FILM WITH THE COATING FORMULATION

CROSS-REFERENCE TO RELATED APPLICATION

This application claims the priority of Japanese Patent Application 2006-278837 filed Oct. 12, 2006, which is incorporated herein by reference.

FIELD OF THE INVENTION

This invention relates to a coating formulation containing a particular organic acid-titanium compound, fine particles of a titanate-based compound and an organic solvent, and a process for producing a titanate-based ceramic film by making use of the coating formulation.

BACKGROUND OF THE INVENTION

Titanate-based ceramic films have been investigated for their applications in a variety of fields. Making use of their dielectric characteristics, in particular, they have already found utility as electronic members in electronic parts or components such as high-dielectric capacitors, ferroelectric capacitors, gate insulating films, barrier films, capacitors and piezoelectric elements.

Production processes of these films include MOD process, sol-gel process, the process that applies and then fires a dispersion of ceramic particles, CVD process, and ALD process. For thin films that require relatively low processing accuracy, preferred are wet coating processes such as sol-gel process, MOD process and the process that applies and then fires a dispersion of ceramic particles, all of which require low production cost and permit easy film formation. As film-forming raw materials for use in these processes, metal alkoxide compounds, metal salts of organic acids, and fine ceramic particles are employed. These wet coating processes, however, have a limit on the thickness of a film available from a single coating step. An increase in the metal content or viscosity of a coating formulation to make greater the thickness of a film available from a single coating step results in a film of deteriorated quality such as a non-uniform or cracked film. To obtain good film quality, a thickness of from 100 to 300 nm or so is a limit per coating. To overcome this limit, processes that mix fine ceramic particles and a sol-gel solution with each other are disclosed in JP-A-11-502262 (specifically, claims 1, 4 and 5) and JP-A-2005-213105 (specifically, claims 1 and 5 and paragraphs [0018] and [0021]), and a process that mixes fine ceramic particles and an MOD solution with each other is disclosed in JP-A-2005-247632 (specifically, claim 1 and paragraph [0080]).

According to the process disclosed in JP-A-11-502262, a dispersion prepared by mixing an organometal sol-gel solution with fine ceramic powder is employed, and coating and firing are repeated at least 5 times to form a polycrystalline film of at least 10 μm. This patent document also discloses titanium isopropoxide as an organometal titanium compound, and also discloses titania films and PZT films as titanate-based ceramic films.

According to the process disclosed in JP-A-2005-213105, a thin, polycrystalline metal oxide film is produced with a dispersion of fine particles of a corresponding metal oxide in a sol-gel solution prepared by mixing an organometal compound, a metal alkoxide or a salt of an organic acid with an organic solvent. As titanate-based thin films, thin films of strontium barium titanate and thin films of magnesium titanate are disclosed. This patent document, however, contains no disclosure about any titanium compound as a raw material for a sol-gel solution.

JP-A-2005-247632 discloses a dispersion of ultrafine particles of a metal oxide, which has been prepared by mixing, with a dispersion of ultrafine particles of a corresponding titanium-containing complex metal oxide, an MOD solution for the same kind of titanium-containing complex metal oxide. The dispersion of the ultrafine particles of the titanium-containing complex metal oxide was obtained by a hydrolysis in a microemulsion. As an MOD solution, a solution comprising barium n-butyrate, titanium isopropoxide, isoamyl butyrate and 2,4-pentadione is disclosed. No sufficient film-thickening effects can, however, be brought about even by the above-described processes, leading to an outstanding demand for further improvements.

WO-A-2004/097854 (specifically, claim 1, page 5, lines 30-37) discloses a liquid coating formulation, in which ferroelectric oxide particles of plate or needle crystals having a perovskite structure represented by $ABO_3$ (A: Ba, Sr, Ca, Pb, Li, K or Na; B: Ti, Zr, Nb, Ta or Fe) and having an average primary particle size of not greater than 100 nm are dispersed and a soluble metal compound capable of forming a ferroelectric oxide when heated is also dissolved. Disclosed as examples of the soluble metal compound include inorganic salts such as nitrates, organic acid salts such as ethylhexanoate salts, organic metal complexes such as acetylacetone complexes, and metal alkoxides. However, the technology disclosed in this patent document is not to decrease the number of repetitions of coating and firing upon production of a thick film, and this document does not contain any specific description about an organic acid-titanium compound.

Further, JP-A-5-230079 (specifically, claim 1, [0007]) discloses organic acid-titanium compounds represented by the following formula:

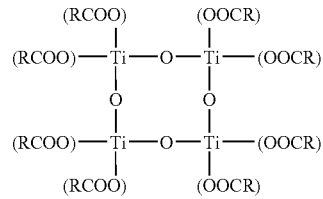

wherein each R represents a $C_{1-17}$ monovalent organic group. These compounds are described to be useful as stable materials in a coating-pyrolysis process for titanium oxide, P(L)ZT and like ferroelectric materials. JP-A-5-58636 (specifically, claim 1, [0012]) discloses a process for the production of lead zirconate titanate, which comprises drying and firing a mixed solution with a titanium salt of an organic acid contained therein. The titanium salts of organic acids, which are described in this patent document, impart stability to coating formulations, but do not act to thicken films.

SUMMARY OF THE INVENTION

Objects of the present invention is, therefore, to provide a coating formulation capable of forming a titanate-based ceramic film of good quality through fewer coating step(s) in its production process by a wet coating process; and a process for the production of the titanate-based ceramic film of good quality.

The present inventors proceeded with investigations. As a result, it was found that a coating formulation with a specific aliphatic organic acid-titanium compound and fine particles of a titanate-based compound contained therein can achieve the above-described objects, leading to completion of the present invention.

In one aspect of the present invention, there is thus provided a coating formulation comprising the following components (A), (B) and (C):

(A) an organic acid-titanium compound having at least one titanium atom and at least one $C_{2-12}$ aliphatic organic acid residual group as essential constituents and having no constituent other than the essential constituents, (B) fine particles of a titanate-based compound, said fine particles having an average particle size of from 10 to 100 nm, and (C) an organic solvent, wherein a content of the components (A) is from 0.1 to 1.5 mol/kg in terms of titanium atoms, and a content of the component (B) is from 0.1 to 1.5 mol/kg in terms of titanium atoms. The organic acid-titanium compound as the component (A) may further contain at least one oxygen atom as an optional constituent. It is to be noted that the term "constituent" is used as a generic term for both "atom" and "group" in this specification.

In another aspect of the present invention, there is also provided a process for the production of a titanate-based ceramic film, which comprises:

a coating step of applying the coating formulation as a coating layer onto a substrate, a drying step of heating the substrate and the coating layer applied thereon at from 100 to 200° C. to dry the coating layer into a green film, and a firing step of heating the substrate and the green film at from 600 to 900° C. to fire the green film.

According to the present invention, a titanate-based ceramic film of good film quality can be provided with a desired thickness through fewer coating step(s).

DETAILED DESCRIPTION OF THE INVENTION AND PREFERRED EMBODIMENTS

A description will firstly be made about the organic acid-titanium compound useful as the component (A) in the present invention.

Examples of the organic acid-titanium compound (A), which has at least one titanium atom and at least one $C_{2-12}$ aliphatic organic acid residual group as essential constituents and at least one oxygen atom as an optional constituent and having no constituent other than said essential and optional constituents, include derivatives formed of only one or more L—Ti bonds (L: $C_{2-12}$ aliphatic organic acid residual group), derivatives formed of one or more L—Ti bonds and one or more Ti—O—Ti bonds, derivatives formed of one or more L—Ti bonds and one or more Ti=O bonds, and derivatives formed of one or more Li—Ti bonds, one or more Ti—O—Ti bonds and one or more Ti=O bonds.

A skeleton of each component (A) formed of one or more Ti—O—Ti bonds may be linear or branched, or may form a ring. For example, one obtained by using as a raw material a monomeric titanium compound such as a tetrahalide, e.g., titanium tetrachloride, or tetra(isopropoxy) titanium generally contains 1 to 6 titanium atoms per molecule, can be easily produced, has good solubility in organic solvents, and therefore, is preferred as the component (A) in the coating formulation according to the present invention. For example, those having structures represented by the following formulas can be mentioned.

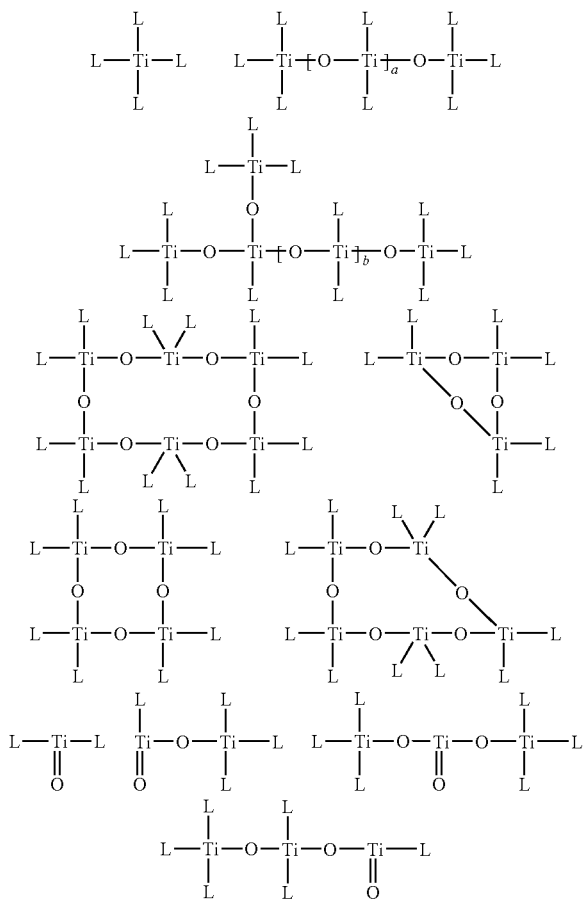

Wherein Ls each independently represent a $C_{2-12}$ aliphatic organic acid residual group, a stands for a number of from 0 to 4, and b stands for 1 or 2.

Examples of an aliphatic organic acid capable of yielding the organic acid residual group or groups in the component (A) include acetic acid, propionic acid, butyric acid, isobutyric acid, valeric acid, caproic acid, caprylic acid, 2-ethylhexanoic acid, pelargonic acid, capric acid, neodecanoic acid, undecanoic acid, lauric acid, cyclohexanecarboxylic acid, acrylic acid, and methacrylic acid.

To obtain a good film in wet coating, it is desired to increase the metal content of a component contained in a coating formulation and the viscosity of the coating formulation. In the coating formulation according to the present invention, however, the content of titanium atoms in the component (A) in the coating formulation cannot be increased because an excessive increase in the content of titanium atoms in the component (A) leads to a reduction in the solubility of the component (A) in an organic solvent. On the other hand, an increase in the content of carbon atoms in the component (A) can provide the coating formulation with a higher viscosity, but an excessive increase in the content of carbon atoms leads to an increase in the content of carbon atoms contained as an impurity in a film available from the coating formulation, bringing about adverse effects such as reductions in the density and strength of the film, a reduction in the uniformity of the film, and occurrence of cracks in the film. As the component (A), one having a titanium atom content of from 8 to 20 wt. % and a carbon atom content of from 30 to 65 wt. % that can impart an adequate degree of viscosity is, therefore, preferred, with one having a titanium atom content of from 8 to 15 wt. % and a carbon atom content of from 40 to 60 wt. % being more preferred.

It is $C_6$, $C_8$ and $C_{10}$ aliphatic organic acids that can afford organic acid-titanium compounds in the above-described preferred range and are economical. Of these, the most preferred is 2-ethylhexanoic acid, which is a synthetic fatty acid, is stable in quality, and has good solubility specific to organic solvents.

As the organic acid-titanium compound for use in the coating formulation according to the present invention, one obtained by applying a conventionally-known general production process can be used irrespective of its production process. Examples of the production process for the organic acid-titanium compound include a process that uses as a raw material a titanium halide such as titanium tetrachloride and a process that uses as a raw material a tetraalkoxytitanium such as tetra(methoxy) titanium, tetra(ethoxy) titanium, tetra(propoxy)titanium, tetra(isopropoxy)titanium or tetra(butoxy)titanium.

Illustrative of the process that uses a titanium halide as a raw material are a process that reacts the titanium raw material and an aliphatic organic acid in the presence of an alkali reactant such as sodium, sodium amide, sodium hydride, diethylamine or triethylamine and a process that reacts a titanium halide with an aliphatic organic acid derivative such as the sodium salt of an aliphatic organic acid, the lithium salt of an aliphatic organic acid or the ammonium salt of an aliphatic organic acid.

Further, examples of the process that uses a tetraalkoxytitanium as a raw material includes a process that adds an aliphatic organic acid and then conducts heating and a process that makes combined use of a dehydrating agent such as an acid anhydride to remove water to be by produced upon reacting a tetraalkoxytitanium with an aliphatic organic acid. The use of an organic acid-titanium compound, which has been obtained using as a raw material a titanium halide such as titanium tetrachloride, as the component (A) for use in the coating formulation according to the present invention may affect the electrical characteristics of the resulting film under the influence of byproducts and the halogen derived from Ti—X (X: halogen atom). The process that uses a tetraalkoxytitanium as a raw material is, therefore, preferred as the production process for the component (A). For example, a 2-ethylhexanoic acid-titanium compound preferred as the component (A) in the coating formulation according to the present invention can be obtained by reacting 2-ethylhexanoic acid with a tetraalkoxytitanium at a molar ratio of 2:1 to 6:1.

A description will next be made about the fine particles of the titanate-based compound as the component (B) for use in the present invention.

The average particle size of the component (B) for use in the present invention ranges from 10 to 100 nm. An average particle size smaller than 10 nm leads to a reduction in the thickness of a film to be obtained through a single coating step, thereby making it difficult to achieve a decrease in the number of coating steps as one of advantageous effects of the present invention. An average particle size greater than 100 nm, on the other hand, leads to a deterioration in the dispersion stability of the component (B) in the coating formulation, thereby developing a problem such as the occurrence of precipitation.

As the component (B), a titanate-based compound is selected such that a film to be obtained finally will have a desired film composition. Examples of the titanate-based compound include titania, barium titanate, strontium titanate, barium strontium titanate, lead titanate, niobium-added lead titanate, lead zirconate titanate, niobium-added lead zirconate titanate, lanthanum-added lead zirconate titanate, and bismuth titanate.

As the particles of the titanate-based compound used as the component (B), conventionally-known general ones can be used irrespective of their production process and crystalline form. The component (B) is usually employed as a dispersion. To keep the fine particles dispersed, the fine particles may contain a dispersant such as a surfactant or may be subjected to surface modification beforehand.

The component (D) which may be used as an optional component in the present invention is the salt between a $C_{2-18}$ organic acid and a metal other than titanium. Examples of the metal species in the component (D) include Group 1 elements such as lithium, sodium, potassium, rubidium and cesium; Group 2 elements such as beryllium, magnesium, calcium, strontium and barium; Group 3 elements such as scandium, yttrium, lanthanoid elements (lanthanum, cerium, praseodymium, neodymium, promethium, samarium, europium, gadolinium, terbium, dysprosium, holmium, erbium, thulium, ytterbium, lutetium), and actinoid elements; Group 4 elements such as zirconium and hafnium; Group 5 elements such as vanadium, niobium and tantalum; Group 6 elements such as chromium, molybdenum and tungsten; Group 7 elements such as manganese, technetium and rhenium; Group 8 elements such as iron, ruthenium and osmium; Group 9 elements such as cobalt, rhodium and iridium; Group 10 elements such as nickel, palladium and platinum; Group 11 elements such as copper, silver and gold; Group 12 elements such as zinc, cadmium and mercury; Group 13 elements such as aluminum, gallium, indium and thallium; Group 14 elements such as silicon, germanium, tin and lead; Group 15 elements such as arsenic, antimony and bismuth; and Group 16 elements such as polonium.

Examples of the organic acid capable of affording the component (D) for use in the present invention include acetic acid, propionic acid, butyric acid, isobutyric acid, valeric acid, caproic acid, caprylic acid, 2-ethylhexanoic acid, pelargonic acid, capric acid, neodecanoic acid, undecanoic acid, lauric acid, tridecanoic acid, myristic acid, pentadecanoic acid, palmitic acid, margaric acid, stearic acid, cyclohexanecarboxylic acid, naphthenic acid, acrylic acid, methacrylic acid, linoleic acid, linoelaidic acid, γ-linolenic acid, linolenic acid, ricinoleic acid, 12-hydroxystearic acid, benzoic acid, salicylic acid, and naphthoic acid.

Among these non-tin metal salts of organic acids, the strontium, barium, lead, zirconium, lanthanoid, bismuth, niobium and tantalum salts of such organic acids are useful. Further, the salts of such metals with $C_{6-10}$ aliphatic organic acids are preferred for their good solubility in organic solvents, with the salts of such metals with 2-ethylhexanoic acid being more preferred. As the mixing ratio of the component (A) to the component (D) in the coating formulation according to the present invention, a mixing ratio can be selected to give a desired film composition.

A description will next be made about the organic solvent for use as the component (C) in the present invention. Examples of the organic solvent employed in the coating formulation according to the present invention include alcoholic solvents, polyol solvents, ketone solvents, ester solvents, ether solvents, aliphatic or alicyclic hydrocarbon solvents, aromatic hydrocarbon solvents, cyano-containing hydrocarbon solvents, and other solvents. They can be used either singly or in combination.

Illustrative of the alcoholic solvents are methanol, ethanol, propanol, isopropanol, 1-butanol, isobutanol, 2-butanol, tertiarybutanol, pentanol, isopentanol, 2-pentanol, neopentanol, tertiary pentanol, hexanol, 2-hexanol, heptanol, 2-heptanol, octanol, 2-ethylhexanol, 2-octanol, cyclopentanol, cyclohexanol, cycloheptanol, methylcyclopentanol, methylcyclohexanol, methylcycloheptanol, benzyl alcohol, 2-methoxyethyl alcohol, 2-butoxyethyl alcohol, 2-(2-methoxyethoxy)ethanol, 2-(N,N-dimethylamino)ethanol, and 3-(N,N-dimethylamino)propanol.

Illustrative of the polyol solvents are ethylene glycol, propylene glycol, 1,2-butanediol, 1,3-butanediol, 1,4-butanediol, 1,5-pentanediol, neopentyl glycol, isoprene glycol (3-methyl-1,3-butanediol), 1,2-hexanediol, 1,6-hexanediol, 3-methyl-1,5-pentanediol, 1,2-octanediol, octanediol (2-ethyl-1,3-hexanediol), 2-butyl-2-ethyl-1,3-propanediol, 2,5-dimethyl-2,5-hexanediol, 1,2-cyclohexanediol, 1,4-cyclohexanediol, and 1,4-cyclohexanedimethanol.

Illustrative of the ketone solvents are acetone, ethyl methyl ketone, methyl butyl ketone, methyl isobutyl ketone, ethyl butyl ketone, dipropyl ketone, diisobutyl ketone, methyl amyl ketone, cyclohexanone, and methylcyclohexanone.

Illustrative of the ester solvents are methyl formate, ethyl formate, methyl acetate, ethyl acetate, isopropyl acetate, butyl acetate, isobutyl acetate, sec-butyl acetate, tert-butyl acetate, amyl acetate, isoamyl acetate, tert-amyl acetate, phenyl acetate, methyl propionate, ethyl propionate, isopropyl propionate, butyl propionate, isobutyl propionate, sec-butyl propionate, tert-butyl propionate, amyl propionate, isoamyl propionate, tert-amyl propionate, phenyl propionate, methyl lactate, ethyl lactate, methyl methoxypropionate, methyl ethoxypropionate, ethyl methoxypropionate, ethyl ethoxypropionate, ethylene glycol monomethyl ether acetate, diethylene glycol monomethyl ether acetate, ethylene glycol monoethyl ether acetate, ethylene glycol monopropyl ether acetate, ethylene glycol monoisopropyl ether acetate, ethylene glycol monobutyl ether acetate, ethylene glycol mono(sec-butyl) ether acetate, ethylene glycol monoisobutyl ether acetate, ethylene glycol mono(tert-butyl)ether acetate, propylene glycol monomethyl ether acetate, propylene glycol monoethyl ether acetate, propylene glycol monopropyl ether acetate, propylene glycol monoisopropyl ether acetate, propylene glycol monobutyl ether acetate, propylene glycol mono(sec-butyl)ether acetate, propylene glycol monoisobutyl ether acetate, propylene glycol mono(tert-butyl)ether acetate, butylene glycol monomethyl ether acetate, butylene glycol monoethyl ether acetate, butylene glycol monopropyl ether acetate, butylene glycol monoisopropyl ether acetate, butylene glycol monobutyl ether acetate, butylene glycol mono(sec-butyl)ether acetate, butylene glycol monoisobutyl ether acetate, buthylene glycol mono(tert-butyl)ether acetate, methyl acetoacetate, ethyl acetoacetate, methyl oxobutanoate, ethyl oxobutanoate, γ-lactone, and δ-lactone.

Illustrative of the ether solvents are tetrahydrofuran, tetrahyropyran, morpholine, ethylene glycol dimethyl ether, diethylene glycol dimethyl ether, triethylene glycol dimethyl ether, dibutyl ether, diethyl ether, and dioxane.

Illustrative of the aliphatic or alicyclic hydrocarbon solvents are pentane, hexane, cyclohexane, methylcyclohexane, dimethylcyclohexane, ethylcyclohexane, heptane, octane, decalin, and solvent naphtha.

Illustrative of the aromatic hydrocarbon solvents are benzene, toluene, ethylbenzene, xylene, mesitylene, diethylbenzene, cumene, isobutylbenzene, cymene, and tetralin.

Illustrative of the cyano-containing hydrocarbon solvents are 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene. Illustrative of the other organic solvents are N-methyl-2-pyrrolidone, dimethyl sulfoxide, and dimethyl formamide.

As the organic solvent, an organic solvent which shows sufficient solubility to the component (A) and component (D) and is easily usable as a coating solvent can be selected. Among the organic solvents, the alcohol solvents are preferred, with 1-butanol being more preferred, because they show good coating properties for various substrates such as silicon substrates, metal substrates, ceramic substrates, glass substrates and resin substrates and can stably disperse fine particles of titanate-based compounds. When a mixed solvent is employed, one containing butanol as a principal component is preferred, a mixed solvent using 50 wt. % or more of 1-butanol being more preferred.

A description will next be made about the composition of the coating formulation of the present invention.

The coating formulation according to the present invention contains, in the organic solvent, the component (A) at from 0.1 to 1.5 mol/kg in terms of titanium atoms and also the component (B) at from 0.1 to 1.5 mol/kg in terms of titanium atoms. In the coating formulation according to the present invention, the component (A) may be dissolved or dispersed in the organic solvent although it may preferably be in a dissolved state. The component (B) is in a state dispersed in the organic solvent.

In the coating formulation according to the present invention, the total content of titanium atoms in the components (A) and (B) may be preferably from 0.2 to 2.0 mol/kg, more preferably from 0.3 to 1.5 mol/kg in terms of titanium atoms. Concerning the molar ratio of the titanium atoms derived from the component (A) to those derived from the component (B), an excessively large molar ratio leads to a reduction in the thickness of a film to be obtained through a single coating step and may impair the advantageous effects of the present invention, while an unduly small molar ratio may lead to a deterioration in film quality. Therefore, the weight ratio (A:B) of the component (A) to the component (B) may be preferably from 5:95 to 95:5, more preferably from 10:90 to 90:10.

When desired to produce a titanate-based film further containing one or more elements in addition to titanium, the coating formulation according to the present invention contains the component (D) selected to give the composition of the film. When producing a film containing barium and/or strontium, for example, the content of the component (D) may preferably be from 0.8 to 1.2 moles per mole of total titanium atoms in the components (A) and (B). If the content of barium and/or strontium as the component (D) is not just enough, the resulting titanate-based film cannot be provided with desired electric characteristics (high dielectric constant or ferroelectricity). When barium strontium titanate is used, the molar ratio of barium to strontium may be preferably from 1:0.7 to 1:0.3.

The coating formulation according to the present invention may contain, in addition to the components described above, one or more optional components to extent not impairing the advantageous effects of the present invention. Such optional components include, for example, a thickening agent, a thixotropic agent, a leveling agent, a defoaming agent, an antigelling agent, and a dispersion stabilizer. These optional components may each be used preferably in an amount of 5 wt. % or smaller, with 1 wt. % or smaller being more preferred.

A description will next be made about the process of the present invention for the production of a titanium-based ceramic film. The film production process according to the present invention comprises a coating step of applying the coating formulation of the present invention as a coating layer onto a substrate, a drying step of heating said substrate and said coating layer applied thereon at from 100 to 200° C. to dry said coating layer into a green film, and a firing step of heating said substrate and said green film at from 600 to 900° C. to fire said green film.

As examples of the above-described substrate for use in the present invention, various substrates such as silicon substrates, metal substrates, ceramic substrates, glass substrates and resin substrates can be mentioned, and no particular limitation is imposed on the substrate. As a coating method in the coating step, spin coating, dip coating, spray coating, mist coating, flow coating, curtain coating, roll coating, knife coating, bar coating, screen printing, inkjet printing, brush coating or the like can be mentioned. The expression "single coat weight of a coating formulation" means an amount of the coating formulation that can cover a substrate undercoating by each coating method. An excessively small coat weight cannot entirely cover a surface under coating, while an unduly large coat weight results in the disposal of the coating formulation in a substantial amount and is uneconomical.

Subsequent to the above-described coating step, a drying step is conducted by heating the substrate and the coating formulation applied thereon at from 100 to 200° C. to remove the solvent from the applied coating formulation such that the coating formulation is dried into a green film. A drying temperature lower than 100° C. requires a long time for the removal (drying) of the solvent, while a drying temperature higher than 200° C. involves a potential problem that the resulting film may be provided with deteriorated smoothness and uniformity due to abrupt drying of the solvent. A more preferred drying temperature may range from 100 to 180° C. A drying time, on the other hand, may range from about 1 to 30 minutes.

After the drying step, firing is conducted at temperatures of from 600 to 900° C. to form a titanate-based ceramic film. A more preferred firing temperature may range from 650 to 800° C. A firing temperature lower than 600° C. requires a long time for the formation of a film, and may lead to the inclusion of substantial residual carbon as an impurity in the film so that the film may not be provided with desired characteristics. Even a firing temperature higher than 900° C. cannot achieve improvements in film characteristics, and such an excessively high firing temperature is uneconomical from the standpoint of energy and moreover, involves potential problems that due to evaporation of film components, a deviation may occur from the desired film composition and migration of one or more components may take place between the film and the substrate. The firing time at the above-described temperature may range from about 5 to 60 minutes.

In the present invention, a calcining step can be included between the drying step and the firing step to perform heating at a temperature lower than the heating temperature in the firing step, and an annealing step may also be included after the firing step. The temperature in the calcining step may range preferably from 150° C. to 600° C., more preferably from 200° C. to 400° C. The temperature in the annealing step may range preferably from 450° C. to 1,200° C., more preferably from 600° C. to 1,000° C. To obtain a desired thickness, the steps from the coating step to the optional step can be repeated a plurality of times. For example, all the steps from the coating step to the firing step can be repeated a plurality of times, or the coating step, drying step and/or calcining step may be repeated a plurality of times.

The above-described calcining step and firing step may be conducted under desired one of various gas atmospheres to promote the formation of a film and/or to provide the film with improved surface conditions and electrical characteristics. Examples of such gases include oxygen, ozone, water, carbon dioxide, hydrogen peroxide, nitrogen, helium, hydrogen, and argon. Further, energy other than heat, such as plasma or various radiations, may be irradiated.

The thickness of the titanate-based ceramic film obtained as described above may range from 100 to 2,000 nm through the single coating, drying and firing steps. By repeating these steps, a thicker film can be formed. The coating formulation according to the present invention can afford a crack-free thick film through a fewer number of coating. However, formation of an excessively large film thickness through single coating may lead to the formation of cracks in the resulting film. The thickness of a film available from single coating may be preferably from 400 to 1,500 nm, more preferably from 500 to 1,200 nm. These titanate-based ceramic films are useful as films in electronic parts or components such as, for example, high-dielectric capacitors, ferroelectric capacitors, gate insulating films, barrier films, capacitors and piezoelectric elements, all of which make use of the dielectric characteristics of the titanate-based ceramic films.

EXAMPLES

The present invention will hereinafter be described in further detail on the basis of Production Example, Examples and Comparative Examples. It is, however, to be noted that the present invention is by no means limited by the following Examples.

Production Example

Production of 2-ethylhexanoic Acid-Titanium Compound

Under a dry argon gas atmosphere, tetra(isopropoxy)titanium (0.5 mole) and dry toluene (250 mL) were charged into a reaction flask in a heating bath, and 2-ethylhexanoic acid (2 moles) was added, followed by refluxing for 4 hours. After toluene and low-boiling substances were distilled off from the reaction system at a heating bath temperature of 135° C., the interior of the system was depressurized from 3 to 1 torr to conduct concentration so that a 2-ethylhexanoic acid-titanium compound (component (A)) was obtained as a yellow viscous liquid (279 g) On the thus-obtained yellow liquid, the following measurements were performed.

(1) Elemental analysis (analysis of titanium atom content: quantitation as titanium dioxide by the ashing method; carbon and hydrogen contents: CHN elemental analysis)

Ti: 12.1 wt. %, C: 54.9 wt. %, H, 8.5 wt. %

Examples 1-3 & Comparative Examples 1-3

The 2-ethylhexanoic acid-titanium compound (component (A)) obtained in the above Production Example and barium 2-ethylhexanoate and strontium 2-ethylhexanoate (component (D)) were dissolved in 1-butanol such that the metal molar ratio of titanium atoms:barium atoms:strontium atoms became 1:0.6:0.4 and the content of titanium atoms became 0.4 mol/kg in terms of the metal, resulting in the preparation of an organic acid-metal salt composition a-1.

On the side, tetra(isoproxy) titanium, barium acetate 0.5-hydrate, strontium acetate 0.5-hydrate and acetyl acetone were dissolved in 1-butanol such that the molar ratio of titanium atoms:barium atoms:strontium atoms:acetyl acetone became 1:0.6:0.4:1. The resultant solution was then refluxed for 2 hours to obtain a composition. To the composition, water was added in an equimolar amount to the tetra(isopropoxy)

titanium, followed by refluxing for 2 hours to prepare a sol-gel composition a'-1 having a titanium atom content of 0.4 mol/kg in terms of the metal.

The composition a-1 or composition a'-1 and a dispersion b-1 of fine particles in 1-butanol, said dispersion b-1 containing $TiBa_{0.6}Sr_{0.4}O_3$ fine particles of 50 nm average particle size at 0.4 mol/kg (the component (B)), or a dispersion b-2 of fine particles in 1-butanol, said dispersion b-2 containing $TiBa_{0.6}Sr_{0.4}O_3$ fine particles of 80 nm average particle size at 0.4 mol/kg (the component (B)), were mixed at the ratios shown in Table 1 to obtain coating formulations Nos. 1-3 according to the present invention (Examples 1-3) and comparative coating formulations Nos. 1-3 (Comparative Examples 1-3), respectively.

substrates of 2 cm×2 cm and then coated at 500 rpm for 10 seconds by spin coating. Subsequently, there were performed a drying step at 120° C. for 10 minutes, a calcining step at 400° C. for 15 minutes, and a firing step at 700° C. for 30 minutes. That film-forming step was performed as many times as described in Table 2 to form barium strontium titanate films on the Pt layers of the substrates, respectively. The thus-obtained films were each subjected to an assessment for surface cracks by eye and optical microscope, a film thickness measurement based on a cross-sectional SEM image, and a composition analysis by X-ray diffraction. The results are shown in Table 2.

TABLE 1

|  | Coating formulation | Organic acid-metal salt composition (parts by weight) | Sol-gel composition (parts by weight) | Fine particle dispersion (parts by weight) | Titanium atom content (mol/kg) |
|---|---|---|---|---|---|
| Example 1 | Coating formulation No. 1 | a-1 (1) | — | b-1 (7) | 0.4 |
| Example 2 | Coating formulation No. 2 | a-1 (7) | — | b-1 (1) | 0.4 |
| Example 3 | Coating formulation No. 3 | a-1 (1) | — | b-2 (7) | 0.4 |
| Comp. Ex. 1 | Comparative coating formulation No. 1 | a-1 | — | — | 0.4 |
| Comp. Ex. 2 | Comparative coating formulation No. 2 | — | — | b-1 | 0.4 |
| Comp. Ex. 3 | Comparative coating formulation No. 3 | — | a'-1 (7) | b-1 (1) | 0.4 |

The parenthesized numerical values in Table 1 each indicate the amount of the corresponding composition or dispersion.

Examples 4-7 & Comparative Examples 4-6

The coating formulations Nos. 1-3 (each 1.5 mL) and comparative coating formulations Nos. 1-3 (each 1.5 mL), which were obtained above, were cast onto $Si/SiO_2/Ti/Pt$ multilayer

TABLE 2

|  | Coating formulation | Times | Cracks | Film thickness (nm) | Composition |
|---|---|---|---|---|---|
| Example 4 | Coating formulation No. 1 | 1 | None | 550 | BST |
| Example 5 | Coating formulation No. 2 | 1 | None | 508 | BST |
| Example 6 | Coating formulation No. 3 | 1 | None | 675 | BST |
| Example 7 | Coating formulation No. 2 | 2 | None | 1007 | BST |
| Comp. Ex. 4 | Comparative coating formulation No. 1 | 1 | None | 182 | BST |
| Comp. Ex. 5 | Comparative coating formulation No. 2 | 1 | None | 119 | BST |
| Comp. Ex. 6 | Comparative coating formulation No. 3 | 1 | None | 312 | BST |

In the composition, "BST" stands for barium strontium titanate. The same shall apply in the subsequent table.

Examples 8-12

To each of the fine particle dispersion b-1 and a dispersion b-3 of fine particles in 1-butanol, said dispersion b-3 containing TiBa$_{0.6}$Sr$_{0.4}$O$_3$ fine particles of 50 nm average particle size at 0.8 mol/kg (the component (B)), the 2-ethylhexanoic acid-titanium compound (component (A)) obtained above in Production Example and barium 2-ethylhexanoate and strontium 2-ethylhexanoate (component (D)) were added at a molar ratio of 1:0.6:0.4 to give the titanium atom contents shown in Table 3, respectively. Coating formulations No. 4 and No. 5 according to the present invention were obtained accordingly.

Those coating formulations (1.5 mL) were coated onto Si/SiO$_2$/Ti/Pt multilayer substrates of 2 cm×2 cm by bar coater (rod: 12 μm gauge) or spin coating (500 rpm, 10 seconds). Subsequently, there were performed a drying step at 120° C. for 10 minutes, a calcining step at 400° C. for 15 minutes and a firing step at 700° C. for 30 minutes to form barium strontium titanate films on the Pt layers, respectively. The thus-obtained films were each subjected to an assessment for surface cracks by eye and optical microscope, a film thickness measurement based on a cross-sectional SEM image, and a composition analysis by X-ray diffraction. The results are shown in Table 4.

TABLE 3

| | Coating formulation | Dispersion of fine particles | Content of titanium atoms (mol/kg) |
|---|---|---|---|
| Example 8 | Coating formulation No. 4 | b-1 | 0.5 |
| Example 9 | Coating formulation No. 5 | b-3 | 1.0 |

TABLE 4

| | Coating formulation | Coating method | Cracks | Film thickness (nm) | Composition |
|---|---|---|---|---|---|
| Example 10 | Coating formulation No. 4 | Bar coating | None | 619 | BST |
| Example 11 | Coating formulation No. 5 | Bar coating | None | 770 | BST |
| Example 12 | Coating formulation No. 5 | Spin coating | None | 1,000 | BST |

As understood from the above-described results, crack-free, barium strontium titanate films of from 508 to 1,007 nm thickness were obtained with the coating formulations Nos. 1 to 5 according to the present invention, respectively, by spin coating or bar coating in a single film forming step. It has also been confirmed that a film thickness is proportional to the number of repetitions of the film forming step.

The invention claimed is:

1. A coating formulation comprising the following components (A), (B) and (C):
   (A) an organic acid-titanium compound having at least one titanium atom and at least one C$_{2-12}$ aliphatic organic acid residual group, and optionally at least one oxygen atom, as essential constituents and having no constituent other than said essential constituents,
   (B) fine particles of a titanate-based compound, said fine particles having an average particle size of from 10 to 100 nm, and
   (C) an organic solvent,
   wherein a content of said components (A) is from 0.1 to 1.5 mol/kg in terms of titanium atoms, and a content of said component (B) is from 0.1 to 1.5 mol/kg in terms of titanium atoms, and
   wherein said component (B) is selected from the group consisting of barium titanate, strontium titanate and barium strontium titanate.

2. A coating formulation according to claim 1, wherein said component (A) has a titanium atom content of from 8 to 20 wt. % and a carbon atom content of from 30 to 65 wt. %.

3. A coating formulation according to claim 1, wherein said component (A) is a 2-ethylhexanoic acid-titanium compound.

4. A coating formulation according to claim 3, wherein said 2-ethylhexanoic acid-titanium compound is a compound obtained by reacting a tetraalkoxytitanium and 2-ethylhexanoic acid at a molar ratio of from 1:2 to 1:6.

5. A coating formulation according to claim 1, further comprising the following component (D):
   (D) at least one non-titanium metal salt of a C$_{2-18}$ organic acid.

6. A coating formulation according to claim 5, wherein said component (D) is at least one salt selected from the group consisting of strontium salts of C$_{2-18}$ organic acids and barium salts of C$_{2-18}$ organic acids, and a content of said component (D) is from 0.8 to 1.2 moles per mole of total titanium atoms in said components (A) and (B).

7. A coating formulation according to claim 6, wherein said component (D) is at least one salt selected from the group consisting of strontium 2-ethylhexanoate and barium 2-ethylhexanoate.

8. A coating formulation according to claim 1, wherein said component (B) is barium titanate.

9. A coating formulation according to claim 1, wherein said component (B) is strontium titanate.

10. A coating formulation according to claim 1, wherein said component (B) is barium strontium titanate.

11. A coating formulation according to claim 1, wherein said organic solvent as said component (C) is 1-butanol.

12. A coating formulation according to claim 1, wherein said organic acid-titanium compound as said component (A) has at least one oxygen atom.

13. A coating formulation according to claim 12, wherein said component (A) is a compound containing from 1 to 6 titanium atoms per molecule.

14. A coating formulation according to claim 12, wherein said component (A) has a titanium atom content of from 8 to 20 wt. % and a carbon atom content of from 30 to 65 wt. %.

15. A coating formulation according to claim 12, wherein said component (A) is a 2-ethylhexanoic acid-titanium compound.

16. A coating formulation according to claim 15, wherein said 2--ethylhexanoic acid-titanium compound is a compound obtained by reacting a tetraalkoxytitanium and 2-ethylhexanoic acid at a molar ratio of from 1:2 to 1:6.

17. A coating formulation according to claim 12, further comprising the following component (D):
(D) at least one non-titanium metal salt of a $C_{2-18}$ organic acid.

18. A coating formulation according to claim 17, wherein said component (D) is at least one salt selected from the group consisting of strontium salts of $C_{2-18}$ organic acids and barium salts of $C_{2-18}$ organic acids, and a content of said component (D) is from 0.8 to 1.2 moles per mole of total titanium atoms in said components (A) and (B).

19. A coating formulation according to claim 18, wherein said component (D) is at least one salt selected from the group consisting of strontium 2-ethylhexanoate and barium 2-ethylhexanoate.

20. A coating formulation according to claim 12, wherein said component (B) is barium titanate.

* * * * *